United States Patent [19]
Petz et al.

[11] Patent Number: 5,504,745
[45] Date of Patent: Apr. 2, 1996

[54] SWITCHING CELL TRANSMISSION DEVICE EMPLOYING DUAL GATE FET'S AS ONE-WAY RF SWITCHING ELEMENT

[75] Inventors: Felix A. Petz, Noordwijk; Wolfgang Greiner, Noordwijkerhout, both of Netherlands

[73] Assignee: Agence Spatiale Europeenne, Paris, France

[21] Appl. No.: 251,942

[22] Filed: Jun. 1, 1994

[51] Int. Cl.[6] ............................... H04J 3/02; H04J 1/08; H03K 17/687

[52] U.S. Cl. .................. 370/69.1; 370/112; 333/103; 327/408; 327/416

[58] Field of Search .................. 370/57, 58.1, 69.1, 370/123, 72, 77, 112; 307/239, 243, 244, 570, 571; 328/104, 105, 153, 154; 333/101, 103; 340/825.79, 825.85, 825.86, 825.89, 825.9, 825.91, 825.92, 825.93; 327/407, 408, 415, 416

[56] References Cited

U.S. PATENT DOCUMENTS

| | | | |
|---|---|---|---|
| 3,836,720 | 9/1974 | Getgen | 370/69.1 |
| 3,969,638 | 7/1976 | Marchetti et al. | 370/112 |
| 3,995,119 | 11/1976 | Pachynski et al. | 370/112 |
| 4,150,256 | 4/1979 | Bernet et al. | 370/112 |
| 4,983,865 | 1/1991 | Ho et al. | 307/571 |

*Primary Examiner*—Hassan Kizou
*Attorney, Agent, or Firm*—Sughrue, Mion, Zinn, Macpeak & Seas

[57] ABSTRACT

The present invention relates mainly to distribution and/or processing devices for RF signals, in particular devices of the following types: signal combiner, signal splitter or divider, time multiplexer, time demultiplexer, frequency multiplexer, amplifier, attenuator, variable delay lines, and a vector modulator type circuit for signal shaping. A device of the invention comprises switching cells based on respective dual gate FETs, and a control signal generator that controls switching to enable the desired functions to be established.

4 Claims, 9 Drawing Sheets

SWITCHING CELL TRANSMISSION DEVICE EMPLOYING DUAL GATE FET'S AS ONE-WAY RF SWITCHING ELEMENT

FIELD OF THE INVENTION

The present invention relates mainly to distribution and/or processing devices for radiofrequency (RF) signals, in particular devices of any of the following types: signal combiner, signal splitter or divider, time multiplexer, time demultiplexer, frequency multiplexer, amplifier, attenuator, variable delay lines, and a signal shaping circuit of the vector modulator type.

BACKGROUND OF THE INVENTION

U.S. Pat. No. 4,983,865 describes a switching matrix for RF signals implementing signal input lines connected to signal output lines via dual gate field effect transistors (dual gate FETs). That prior art states that the matrices apply to switching devices enabling selective connections to be made between a plurality of inputs and a plurality of outputs, a plurality of inputs and a single output, or a single input and a plurality of outputs. Nevertheless, that patent states that the switching elements are normally controlled in such a manner that at any given moment one input is connected to one output.

Various devices for distribution and/or processing of RF signals are also known that do not give entire satisfaction with respect to bandwidth, response time, bulk, electrical power consumption by the operating control signals, insertion loss, or signal attenuation.

OBJECTS AND BRIEF SUMMARY OF THE INVENTION

Consequently, an object of the present invention is to provide a device for distribution and/or processing RF signals of large bandwidth.

Another object of the present invention is to provide a distribution and/or processing device for high speed RF signals.

Another object of the present invention is to provide a distribution and/or processing device for RF signals that is compact.

Another object of the present invention is to provide a distribution and/or processing device for RF signals that has low electricity consumption.

Another object of the present invention is to provide a distribution and/or processing device for RF signals that gives rise to low losses or attenuation.

Another object of the present invention is to provide a distribution and/or processing device for RF signals that is both-way.

According to the invention, these objects are achieved by a device comprising switching cells advantageously constituted by dual gate FETs, and a control signal generator that ensures the switching that enables the desired functions to be established.

The invention mainly provides a signal distribution and/or processing device comprising a plurality of inlets and/or outlets, characterized in that it comprises a plurality of switching cells, each including a one-way RF switching element interconnecting the input(s) to the output(s) on command, and a simultaneous and/or sequential control circuit for controlling the ON or OFF states of the various one-way switching elements in such a manner as to set up the desired RF signal distribution or processing.

The invention also provides a device characterized in that the switching elements are dual gate FETs.

The invention also provides a combiner/power-divider comprising:
  n (where n is an integer greater than 1) first input lines forming the n inputs of the combiner and/or the n outputs of the power-divider;
  a second input line forming the output of the combiner or the input of the power-divider;
  a third output line connected to the second input line forming the output of the combiner and/or the input of the power-divider;
  n fourth output lines each connected to one of the n first input lines forming the n inputs of the combiner and/or the n outputs of the power-divider;
  n first switching elements connecting, on command, the n first input lines forming n inputs of the combiner and/or the n outputs of the power-divider to the third output line; and
  n second switching elements connecting, on command, the second input line forming the output of the combiner and/or the input of the power-divider to n fourth output lines connected to the n input lines forming the n inputs of the combiner and/or n outputs of the power-divider.

The invention also provides a combiner and/or power-divider, characterized in that it comprises:
  a) a first block of n×n switching cells comprising:
    n input lines forming n inputs of the combiner and/or the n outputs of the power-divider;
    a first output line;
    n first switching elements; and
  b) a second switching block comprising:
    an input line forming the output of the combiner and/or the input of the power-divider;
    n output lines connected to the input lines forming the n inputs of the combiner and/or the n outputs of the power-divider; and
    n second switching elements.

The invention also provides a transmission device characterized in that it comprises:
  a) a multiplexer including:
    n (where n is an integer greater than 1) input lines;
    an output line;
    n switching elements connecting the n input lines to the output line;
  b) a demultiplexer including:
    an input line;
    n output lines;
    n switching elements connecting, on command, the input line to the n output lines;
  c) a transmission line connecting the output line of the multiplexer to the input line of the demultiplexer; and
  d) at least one control circuit ensuring synchronous sequential distribution of the switching elements of the multiplexer and of the demultiplexer.

The invention also provides a transmission device characterized in that it comprises:
  a) a multiplexer including:
    n (where n is an integer greater than 1) input lines;
    an output line;
    n switching elements connecting the n input lines to the output lines;

b) n bandpass filters centered on n frequencies, each connected to one of the n input lines of the multiplexer;

c) a demultiplexer including:
   an input line;
   n output lines;
   n switching elements connecting on command the input line to the n output lines;

d) a transmission line connecting the output line of the multiplexer to the input line of the demultiplexer; and e) at least one control circuit ensuring synchronous, sequential, or simultaneous switching of the switching elements of the multiplexer and of the switching elements of the demultiplexer.

The invention also provides a device for digitally controlling the amplitude of a radiofrequency signal, characterized in that it comprises an input and an output suitable for being interconnected on command by means of a plurality of switching elements disposed in parallel, the amplitude of the output signal being an increasing function of the number of switching elements actually connecting the input to the output, said amplitude preferably being proportional to said number.

The invention also provides a device characterized in that it comprises:

a) a switching block comprising a plurality of input lines connected in series and a plurality of output lines;

b) a second switching block comprising a plurality of output lines connected in series and a plurality of input lines; and c) connection means connecting each of the output lines of the first switching block to a single input line of the second switching block.

The invention also provides a device, characterized in that it comprises:

a) a power-divider;

b) a first set of attenuators of various values connected to the various outputs of the power-divider;

c) a switching block in which each input is connected to the output of one of the attenuators of the first set of attenuators;

d) a second set of attenuators of various values whose inputs are connected to the output lines of the switching blocks; and e) a combiner in which each input is connected to the output of one of the attenuators of the second set of attenuators.

The invention also provides a vector modulator characterized in that it comprises a first switching block comprising a plurality of input lines connected via delay lines and output lines connected to the input lines of a second switching block whose output lines are connected in series.

BRIEF DESCRIPTION OF THE DRAWINGS

The invention will be better understood from the following description and the accompanying figures of non-limiting examples, in which.

MORE DETAILED DESCRIPTION

In FIGS. 1 to 9, the same references are used to designate the same elements.

Figure 1:
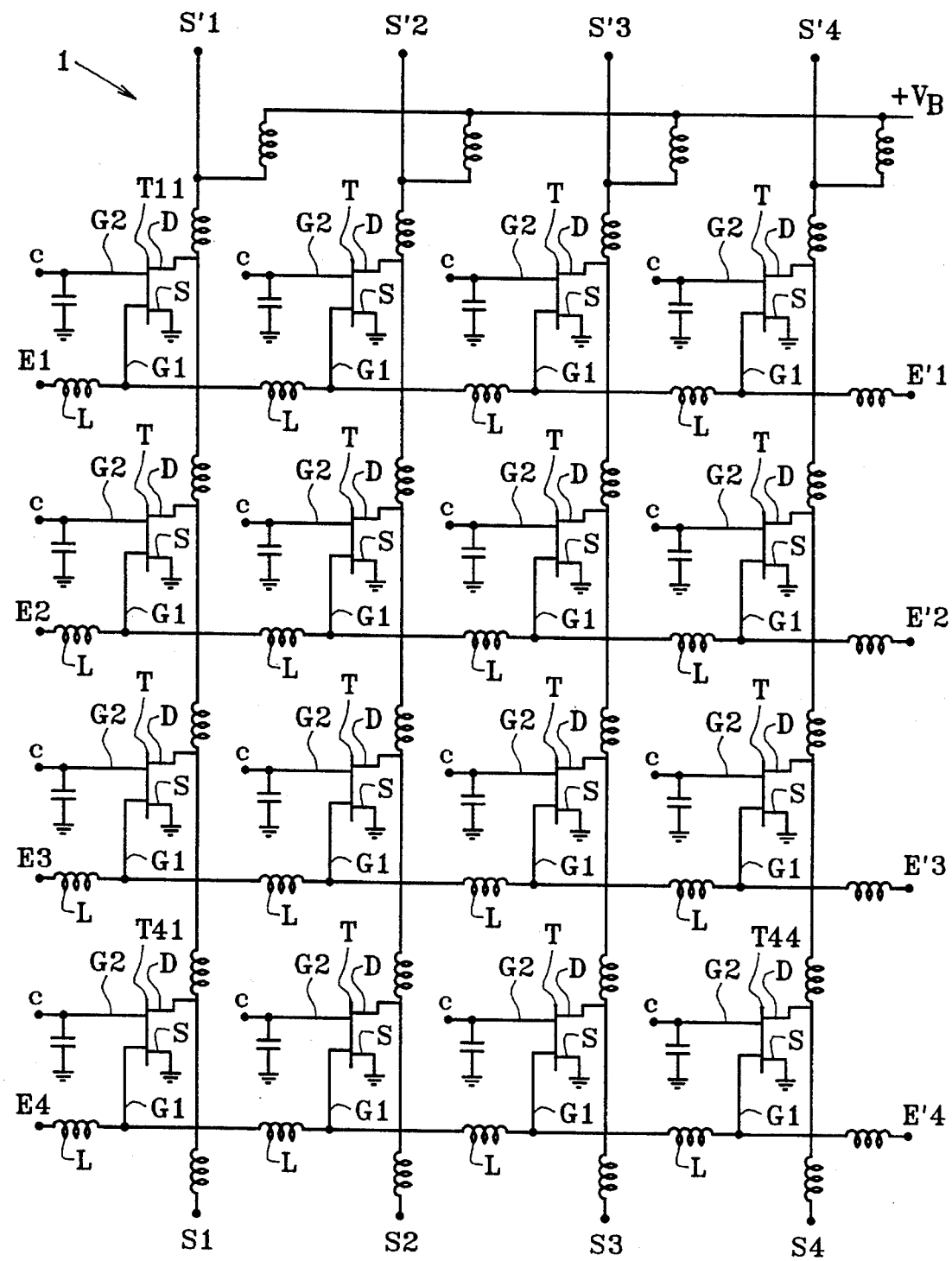
FIG. 1 is a circuit diagram of the preferred embodiment of a switching matrix suitable for being implemented in a device of the invention.

The switching block 1 suitable for being implemented in a device of the invention and as shown in FIG. 1 includes m input lines $E1-E'1, E2-E'2, \ldots, Em-E'm$ (where m is equal to 4 in the non-limiting example shown) and n output lines $S1-S'1, S2-S'2, \ldots, Sn-S'n$ (where n is equal to 4 in the non-limiting example shown). Each input line $Ei-E'i$ ($1 \geq i \geq m$) includes n+1 inductors L connected in series. Each output line $Sj-S'j$ ($1 \geq j \geq n$) includes m+1 inductors L connected in series.

Each input line $Ei-E'i$ is connected to each output line $Sj'-S'j$ via a FET $TiJ$ having two gates G1 and G2. More precisely, the gate G1 of a FET $Tij$ is connected to an input line $Ei-E'i$ at a point situated between two consecutive inductors L thereof, whereas its drain D is connected to the corresponding output line $Sij$ at a point situated between two consecutive conductors L thereof. The second gate G2 of transistor $Tij$ is connected to a control terminal $cij$ on which a voltage signal is applied to cause the transistor $Tij$ to take up the ON state or the OFF state, and the source S of the FET is connected to ground 3.

The input lines $Ei-E'i$ and the output lines $Si-S'i$ selectively interconnected by the FETs $Tij$ are disposed in an orthogonal matrix configuration in which, with reference to FIG. 1, the parallel input lines are disposed horizontally and the parallel output lines are disposed vertically.

Each input line $Ei-E'i$ forms a delay line constituted by the set of inductors L and the set of capacitors constituted by the capacitances of the gates G1 of the FETs $TiJ$. Similarly, each output line $Sj-S'j$ forms a delay line constituted by the set of inductors L and by the set of capacitors constituted by the capacitances of the drains D of the FETs $Tij$.

In general, with reference to the configuration shown in FIG. 1, a first end of each input line $Ei'E'i$ constitutes a first input terminal $Ei$ while the other end thereof constitutes a second input terminal $E'i$ which, in certain applications, may be connected to ground 3 via a terminating load impedance Z such as a resistor having a resistance of 50 ohms, for example. A first end of each output line $SJ-S'J$ constitutes a first output terminal $Sj$ while the opposite end of each output line constitutes a second output terminal $S'J$ connected via a terminating load impedance Z to a power supply V at +5 volts, for example.

Each FET $TiJ$ may be considered a voltage controlled current source. Thus, when a positive voltage relative to ground is applied to the control input $cij$, the FET takes up a conductive or "ON" state in which it allows RF signals to pass and amplifies them a little, whereas a small negative voltage on the control input keeps the FET in the non-conductive or "OFF" state.

The switching block 1 is thus constituted by a matrix of switching elements enabling one or more input lines to be selectively connected on command to one or more output lines.

The switching block 1 configured as shown in FIG. 1 has the following characteristics.

By definition, the capacitances of the gate G1 and of the drain D of each FET T remain substantially constant regardless of the ON or OFF state of the transistor. Under such conditions, any signal applied to a terminal Ei or E'i of an input line Ei–E'i always sees the same impedance formed by the inductors L, the gate capacitances G1 of the FET T associated with said line, and possibly the load impedance Z. Under such conditions, any signal applied to a terminal Ei or E'i will not be subjected to any disturbance or distortion along the input line Ei–E'i. In similar manner, any signal present on an input line Ei–E'i which is switched to an output line SJ–S'J by the associated switching element TiJ likewise always sees the same impedance constituted by the inductors L, the drain capacitances of the FETs Tij, and possibly also the terminating impedance Z, such that the signal is not subjected to disturbance or distortion along the output line SJ–S'J.

As a result, a signal applied to one of the input terminals Ei of the switching block can be applied simultaneously to a plurality of the output terminals S1 and S'1, S2 and S'2, . . . , Sn and S'n of the block, which corresponds to a simultaneous broadcast mode of operation as used in many of the applications described below.

In general, since the switching block 1 is more particularly intended for RF applications, the delays actually imparted by the delay lines are very small and may often be ignored, i.e. so long as the period of the RF signal in question is not of the same order of magnitude as the delay imparted by the switching block. Naturally, and if necessary, the delay may be compensated, e.g. by means of another switching block placed upstream, or on the contrary used to ensure that a desired delay is obtained.

Naturally, the switching block 1 enables an arbitrary input combination to be selected which can be associated with an arbitrary output combination. This can be done merely by appropriately controlling the ON and OFF states of the FETs Tij.

Even though the dual gate FETs Tij provide particularly high performance, it is naturally possible to implement other types of one-way switching element between the input lines Ei–E'i and the output lines Sj–S'j without going beyond the ambit of the present invention, e.g. PIN diodes or other types of field-effect transistor.

In FIGS. 2 to 9, the one-way switching elements used are advantageously dual gate FETs and they are represented by sloping arrows 4 or 4.ij connecting the input lines Ei–E'i to the output lines Sj–S'j.

Naturally, the number of input and/or output lines is given purely by way of non-limiting example.

Figure 2:
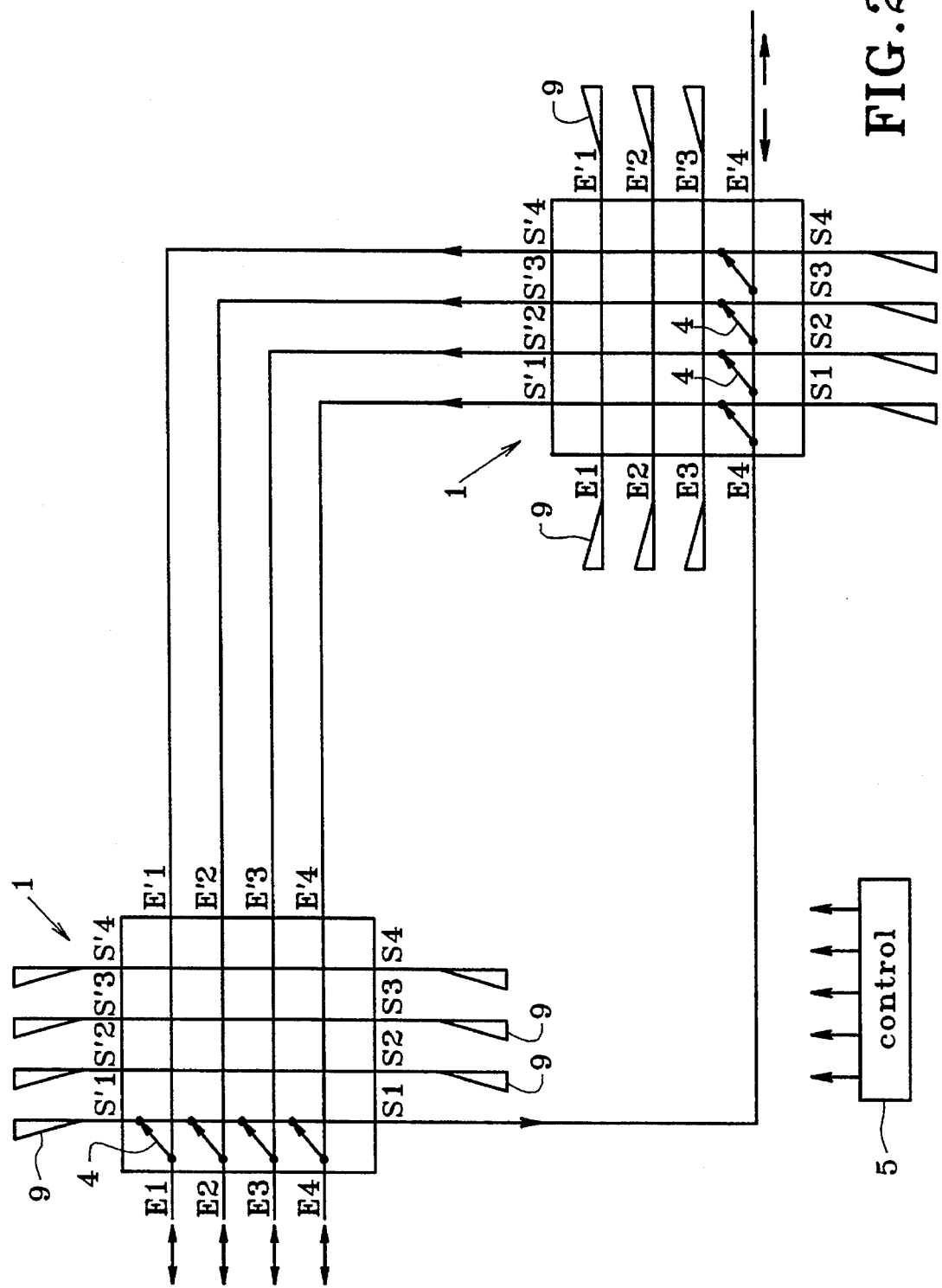
FIG. 2 is a diagram of a both-way combiner of the present invention.

FIG. 2 illustrates a both-way distribution device forming a combiner for applying the analog sum of the RF signals from four input lines to an output line, or forming an RF power-divider going from said one line to said four lines forming the inputs of the combiner. The device of FIG. 2 comprises two switching blocks 1 each comprising a matrix of 4×4 switching cells. Terminals E1 to E4 of the input lines E1–E'1 to E4–E'4 of the first block form the inputs of the combiner and the outputs of the power-divider. Terminal E'4 of input line E4–E'4 of the second block 1 forms the output of the combiner and the input of the power-divider. The terminals E'1, E'2, E'3, and E'4 of the first block 1 are respectively connected to the terminals S'1, S'2, S'3, and S'4 of the second block 1. The terminal S1 of the first block 1 is connected to the terminal E4 of the second block 1. In combiner mode, a control circuit 5 serves to switch the switching elements 4.11, 4.21, 4.31, and 4.41 simultaneously into the ON state, thereby connecting the input lines E1–E'1, E2–E'2, E3–E'3, and E4–E'4 respectively to the output line S1–S'1 of the first block 1 thus connecting the terminals E1, E2, E3, and E4 to the terminal E'4 of the second block 1. The switching elements 4.11, 4.21, 4.31, and 4.41 in the embodiment of FIG. 1 correspond to FETs T11, T21, T31, and T41. Advantageously, all of the unused inputs and outputs have a matched terminating load impedance 9, in particular a 50 Ω resistor.

In power-divider mode, the control circuit 5 serves to put the switching elements 4.41, 4.42, 4.43, and 4.44 on the second block 1 simultaneously into the ON state, thereby connecting the terminal E'4 of the second block 1 to the terminals S'1, S'2, S'3, and S'4 of the second block 1, and consequently to the terminals E1, E2, E3, and E4 of the first block 1.

The device of FIG. 2 has the following performance:

operating center frequencies lying in the range 0 to 10 GHz;

bandwidths lying in the range 0 to 10 GHz;

insertion losses less than 3 dB;

power required for switching the elements 4:200 mW;

the connection can be set up alternately in one direction and in the other; and the blocks 1 include redundant elements.

Figure 3:
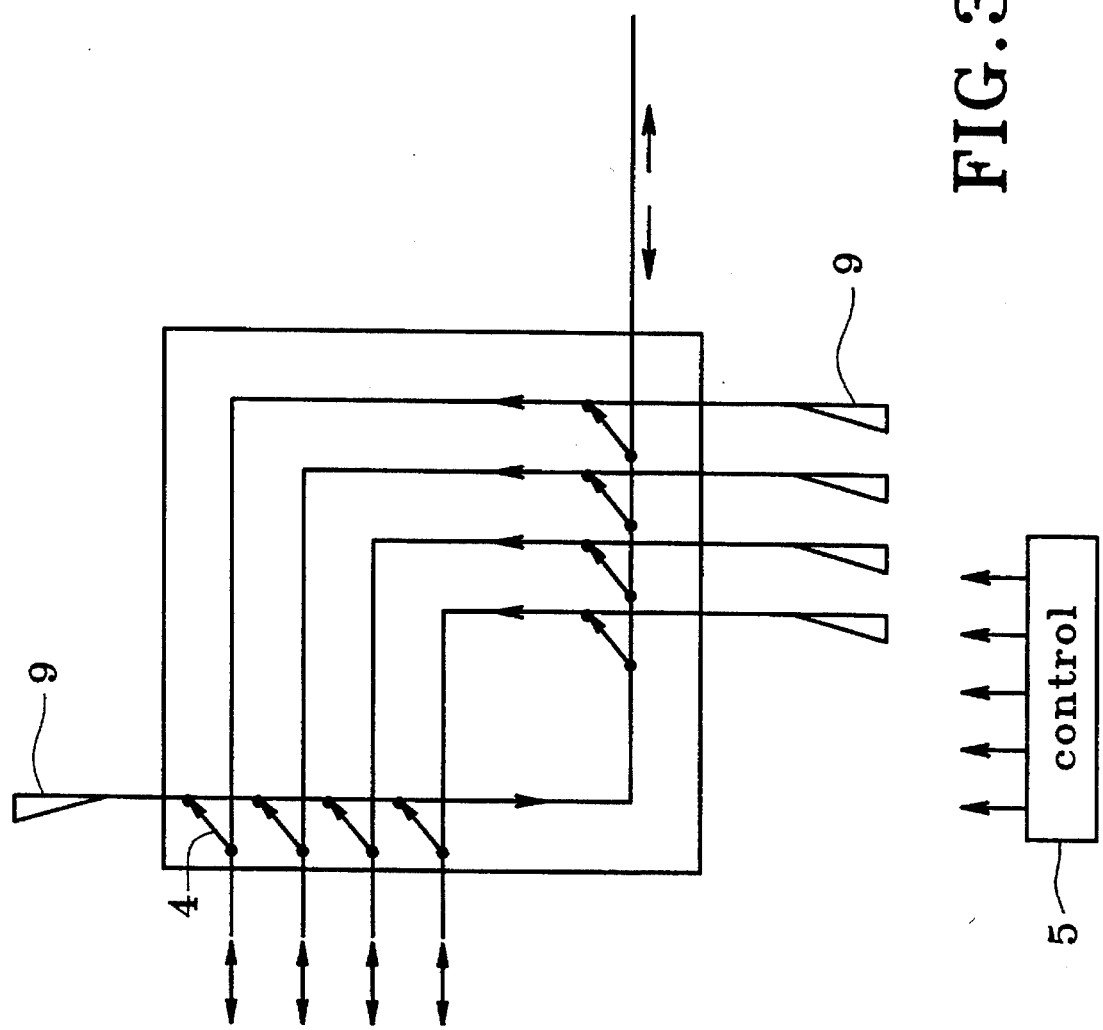
FIG. 3 is a diagram of a variant embodiment of the FIG. 2 combiner.

In the example of FIG. 2, two standard matrix switching blocks are used. It is thus possible to implement circuits that function in a manner that is determined by the control circuit 5 and by the external interconnections. The use of standard circuits is particularly advantageous when only a small number of devices of the invention are to be made. In a variant embodiment shown in FIG. 3, there can be seen an optimized circuit in which only the active switching elements, namely 4.11, 4.21, 4.31, 4.41, 4.41, 4.42, 4.43, and 4.44 are implemented. Advantageously, the device of FIG. 3 is implemented in the form of a single integrated circuit in which internal connections are provided that correspond to the connections of the input lines of the first block 1 to the output lines of the second block 2 of the FIG. 2 device. In a variant embodiment, the switching matrix and the control circuit 5 are made in the form of a single integrated circuit.

The optimized version of the device shown in FIG. 3 is advantageous when manufacturing circuits in medium to long runs, and also for applications, particularly in space, that require devices of very small volume and/or of very small mass.

Figure 4:
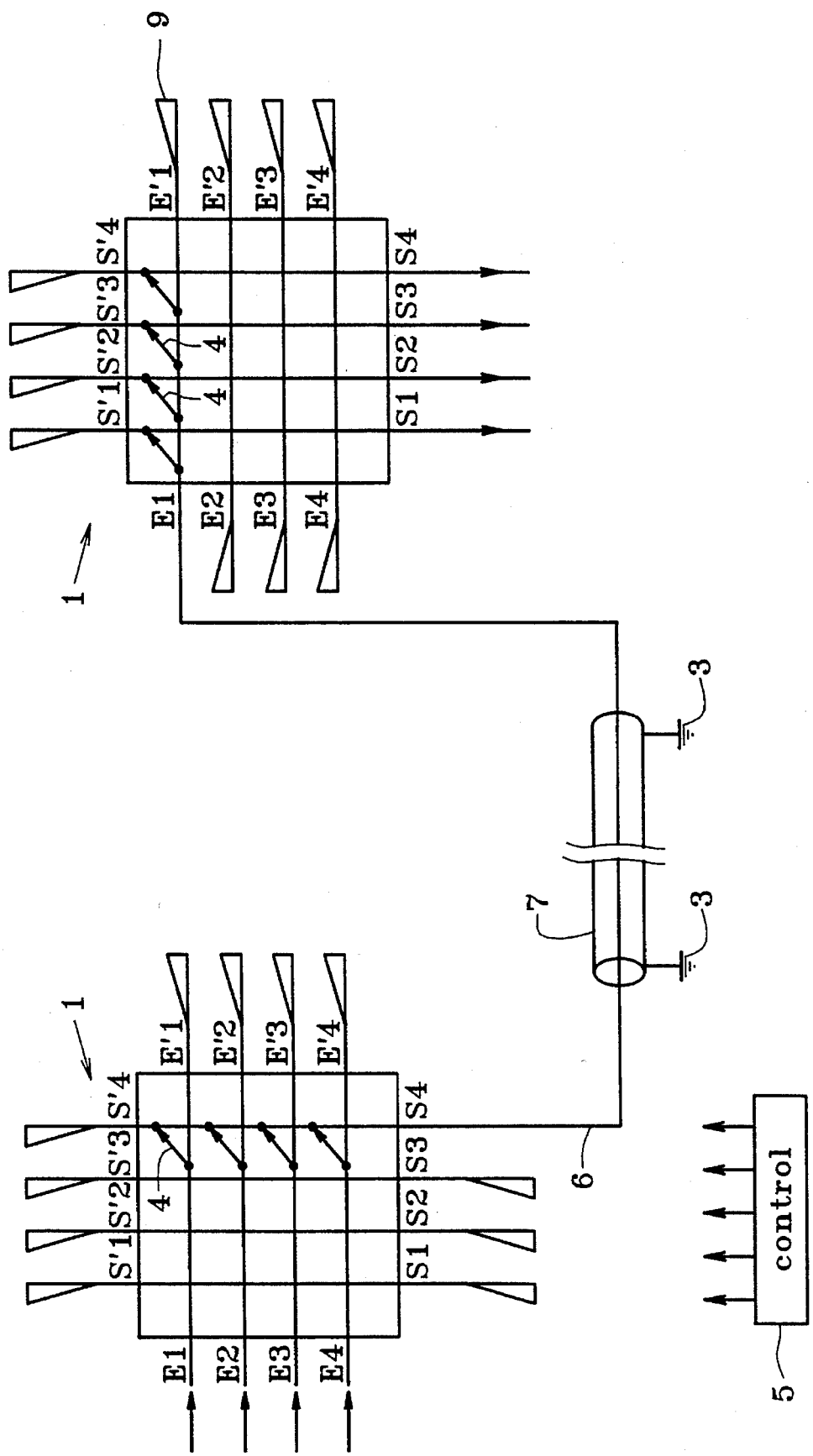
FIG. 4 is a diagram of a time multiplexer-demultiplexer of the present invention.

FIG. 4 illustrates an embodiment of a multiplexer-demultiplexer of the present invention comprising a first switching block 1 and a second switching block 1 interconnected by a communications line 6, e.g. a coaxial cable whose screening 7 is connected to ground 3. In the example shown, the line 6 connects the terminal S4 of the first block 1 to the terminal E1 of the second block 1. The terminals E1 to E4 of the first switching block 1 form the inputs of the multiplexer. The control circuit 5 sequentially activates the switches 4.14, 4.24, 4.34, and 4.44 of the first block 1 forming the multiplexer.

The terminals S1, S2, S3, and S4 of the second block 1 form the outputs of the demultiplexer. The control circuit 5 sequentially switches the one-way switching elements 4.11, 4.12, 4.13, and 4.14 of the second block 1 forming the demultiplexer.

Naturally the multiplexer of the present invention may comprise a first control circuit 5 for controlling the first switching block 1 and a second control circuit 5 for controlling the second switching block 1, the two control circuits 5 being synchronized by signals transmitted over the line 6 or by dedicated synchronization signals.

The multiplexer of FIG. 4 has an electrical power consumption of 100 mW.

Figure 5:
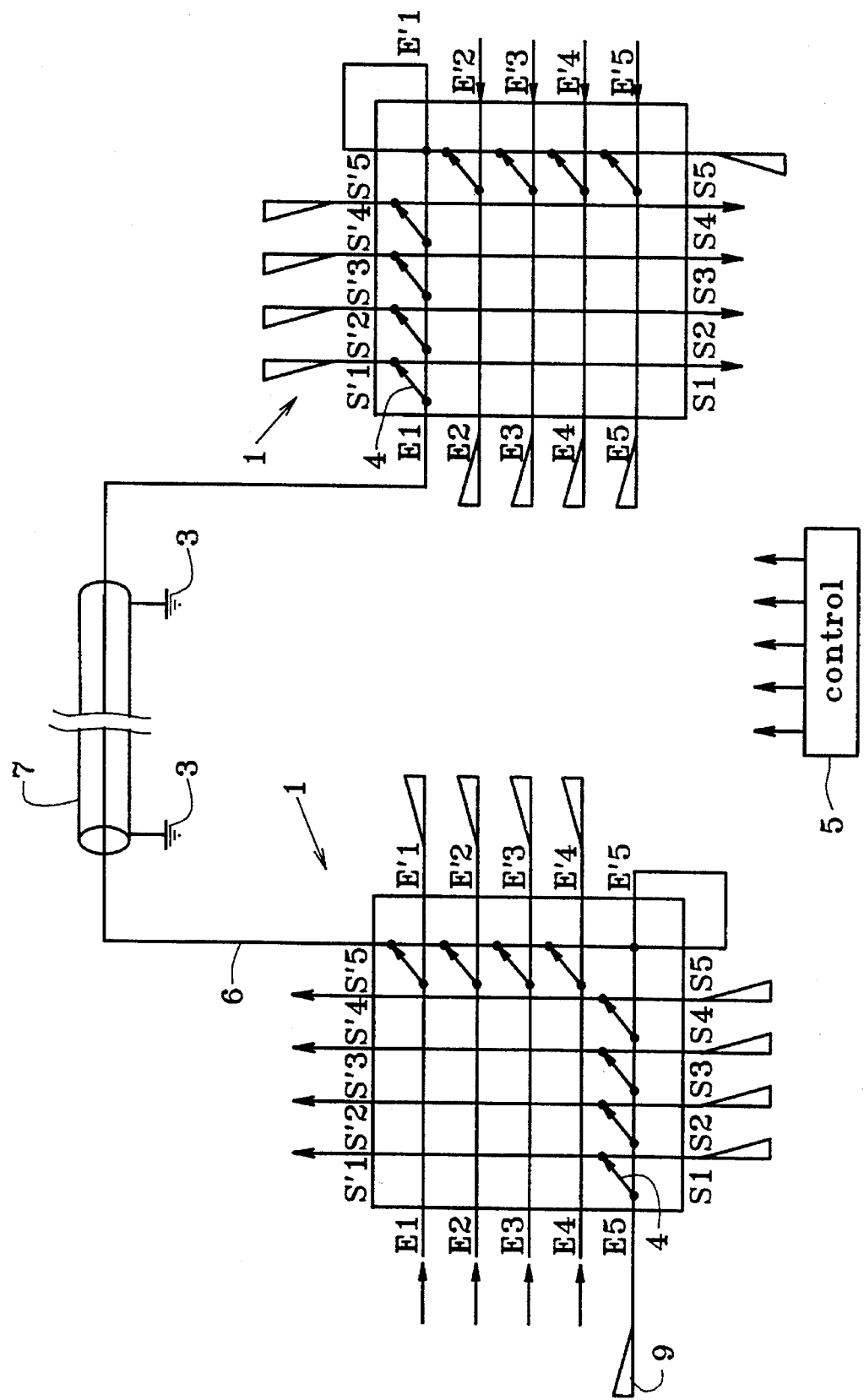
FIG. 5 is a diagram of a both-way time multiplexer-demultiplexer of the present invention.

FIG. 5 illustrates an example of a both-way multiplexer-demultiplexer. In the example shown, a first switching block 1 is used comprising a matrix of 5×5 switching elements 4, the terminals E1, E2, E3, and E4 of the first switching block forming the inputs of the multiplexer for a first direction of operation. The terminals S'1, S'2, S'3, and S'4 of the first block 1 form the outputs of the demultiplexer in a second direction of operation. A first end of the line 6 is connected to the input line E5–E'5 and to the output line S5–S'5 of the first switching block 1 whereas its other end is connected to the input line E1–E'1 and to the output line S5–S'5 of the second switching block 1. The lines E5–E'5 and S5–S'5 of the switching block 1 are interconnected by a both-way link internal to the block 1 or by an external connection interconnecting the terminals S5 and E'5. The lines E1–E'1 and S5–S'5 of the second block 1 are interconnected by an internal both-way link within the second block 1 or by an external connection between the terminals S'5 and E'1.

The switching elements 4.15, 4.25, 4.35, and 4.45 of the first switching block 1 are turned ON sequentially by the control circuit 5 to multiplex RF signals in the first direction of propagation. The switching elements 4.11, 4.12, 4.13, and 4.14 of the second switching block 1 are turned ON sequentially by the control circuit 5 to demultiplexer RF signals transmitted by the line 6 in the first direction of propagation. The switching elements 4.25, 4.35, 4.45, and 4.55 of the second switching block 1 are turned ON sequentially by the control circuit 5 to perform signal multiplexing in the second direction of propagation. The switching elements 4.41, 4.42, 4.43, and 4.44 of the first switching block 1 are turned ON sequentially by the control circuit 5 to demultiplex signals propagating along the line 6 in the second direction.

Figure 6:
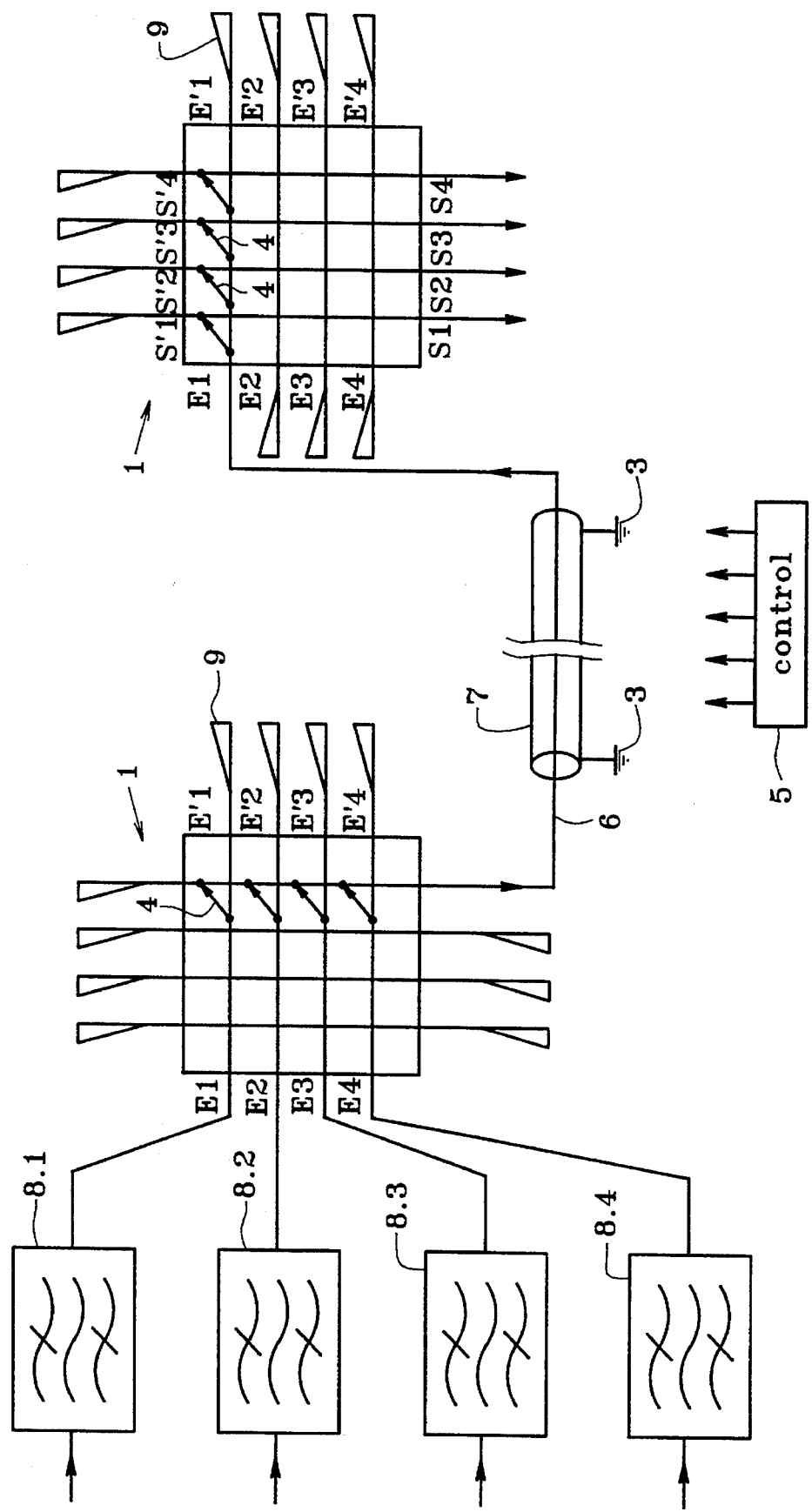
FIG. 6 is a diagram of a frequency multiplexer of the present invention.

FIG. 6, illustrates a frequency multiplexer comprising a first switching block 1 receiving signals in various frequency bands and a second switching block 1 that performs time demultiplexing of the signals received.

In the embodiment shown in FIG. 6, a first bandpass signal 8.1 centered on a first frequency is connected to the terminal E1 of the first switching block, a second bandpass filter 8.2 centered on a second frequency is connected to the terminal E2 of the second switching block 1, a third bandpass filter 8.3 centered on a third frequency is connected to the terminal E3 of the first switching block 1, and a fourth bandpass filter 8.4 centered on a fourth frequency is connected to the terminal E4 of the first switching block 1. The inputs of the filters 8.1 to 8.4 are fed either by different signals or by a single RF signal. When fed with the same signal, it is advantageous for the filters 8 to pass consecutive frequency bands. In the first switching block 1, the switching elements 4.14, 4.24, 4.34, and 4.44 serve simultaneously or sequentially to connect the input lines E1–E'1, E2–E'2, E3–E'3, and E4–E'4 to the output line S4–S'4. Synchronously, in the second switching block, the switching elements 4.11, 4.12, 4.13, and 4.14 connect the line E1–E'1 to the lines S1–S'1, S2–S'2, S3–S'3, and S4–S'4. Thus, for example, when the signal reaching the filter 8.1 is conveyed over the line 6 to the input line E1–E'1 of the second switching block 1, the switching element 4.11 of said block makes a connection with the output line S1–S'1, while the other output lines are isolated from the line E1–E'1. Similarly, the signal delivered by the filter 8.2 appears on the terminal S2 of the second switching block 1, the signal delivered by the filter 8.3 appears on the terminal S3 of the second switching block 1, and the signal delivered by the filter 8.4 appears on the terminal S4 of the second switching block 1. Thus, time demultiplexing only of the signals filtered by the filters 8.1 to 8.4 is performed, with frequency demultiplexing being possibly only by implementing frequency filters identical or equivalent to the filters 8.1 to 8.4 at the output of the line 6.

The frequency multiplexer of FIG. 6 has a power consumption of 400 mW and a switching speed of 10 ns.

Figure 7:
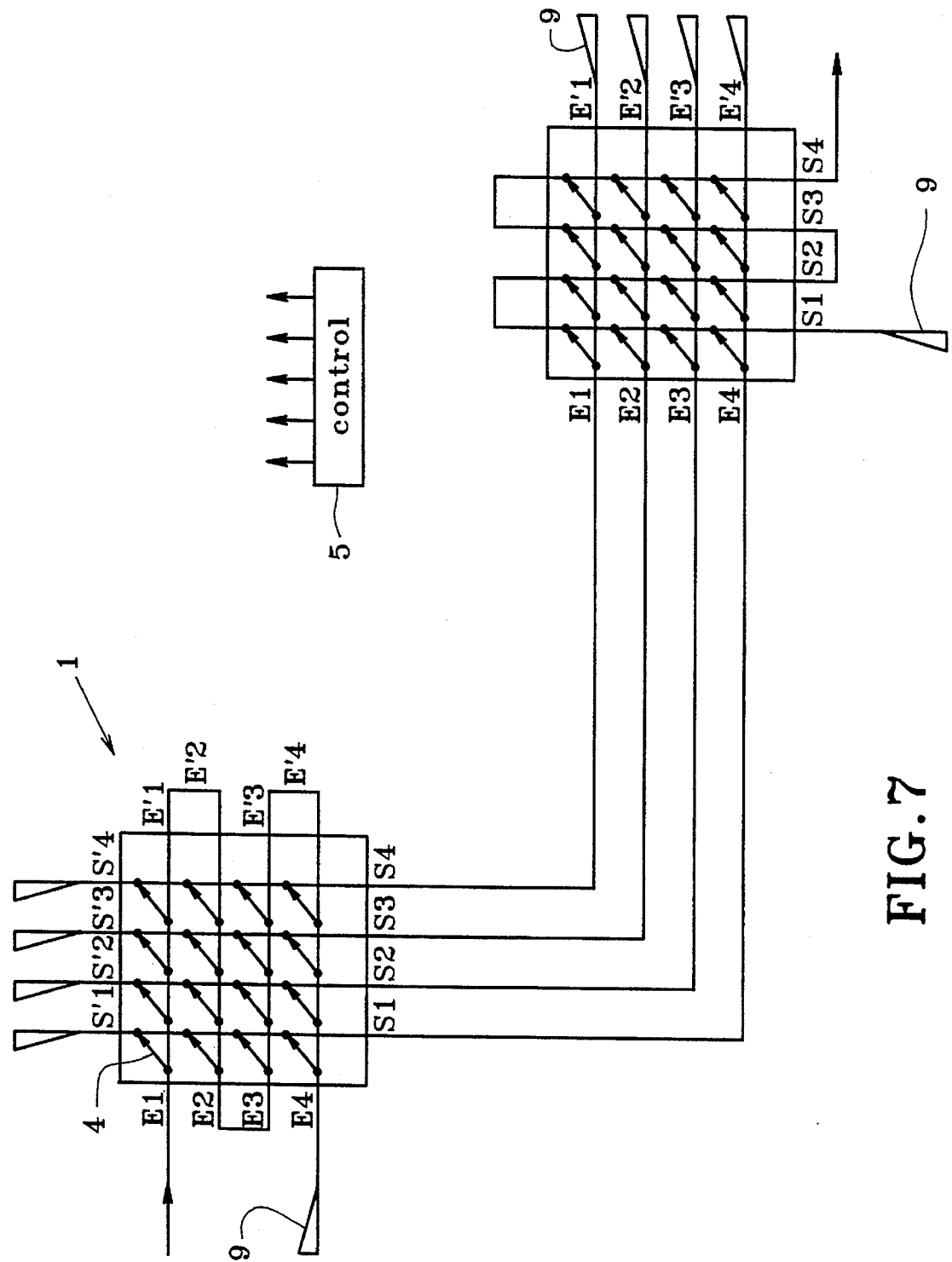
FIG. 7 is a diagram of a first embodiment of a device for controlling the amplitude of a transmitted signal.

FIG. 7, illustrates a wideband device for digitally controlling the amplitude of an RF signal. The device comprises two switching blocks 1, each including a matrix of 4×4 switching elements. The input of the device is connected in parallel to all of the switching elements 4 of the first switching block 1, with each output line from the first switching block 1 being connected to a single input line of the second switching block 1, and with the output from all of the switching elements of the second switching block 1 being connected in parallel to the output of the device. In the example shown, the terminal E1 of the first block forms the input of the device, the terminal E'1 is connected to the terminal E'2, the terminal E2 is connected to the terminal E3, and the terminal E'3 is connected to the terminal E'4. Advantageously, the terminal E4 is connected to a matched load, e.g. a 50 Ω resistor 9 connected to ground. The line S1–S'1 of the first switching block is connected to the line E4–E'4 of the second switching block; the line S2–S'2 of the first switching block is connected to line E3–E'3 of the second switching block; the line S3–S'3 of the first switching block is connected to the line E2–E'2 of the second switching block; and the line S4–S'4 of the first switching block is connected to the line E1–E'1 of the second switching block. Advantageously, the terminal S1 of the second block is connected to a matched load 9.

When all of the switching elements 4 are in the OFF state, the amplitude of the signal at the terminal S4 of the second switching block 1 is zero independently of the amplitude of the signal at the terminal E1 of the first switching block. Minimum amplitude is obtained when only one switching element 4 of the first and second switching blocks is in the ON state. The amplitude of the signal is increased by causing an increasing number of switching elements 4 to take up the ON state. The amplitude of the signal is maximal when all of the switching elements 4 are in the ON state.

The device of FIG. 7 comprises $2 \times 16 = 32 = 2^5$ switching elements 4. If all of the switching elements have the same gain and the same insertion loss, then the device of FIG. 7 has a dynamic range of 5 bits. This dynamic range can be further increased by using switching blocks having a larger number of switching elements 4 and/or by using two switching blocks whose switching elements do not have the same Gain or the same insertion losses.

Figure 8:
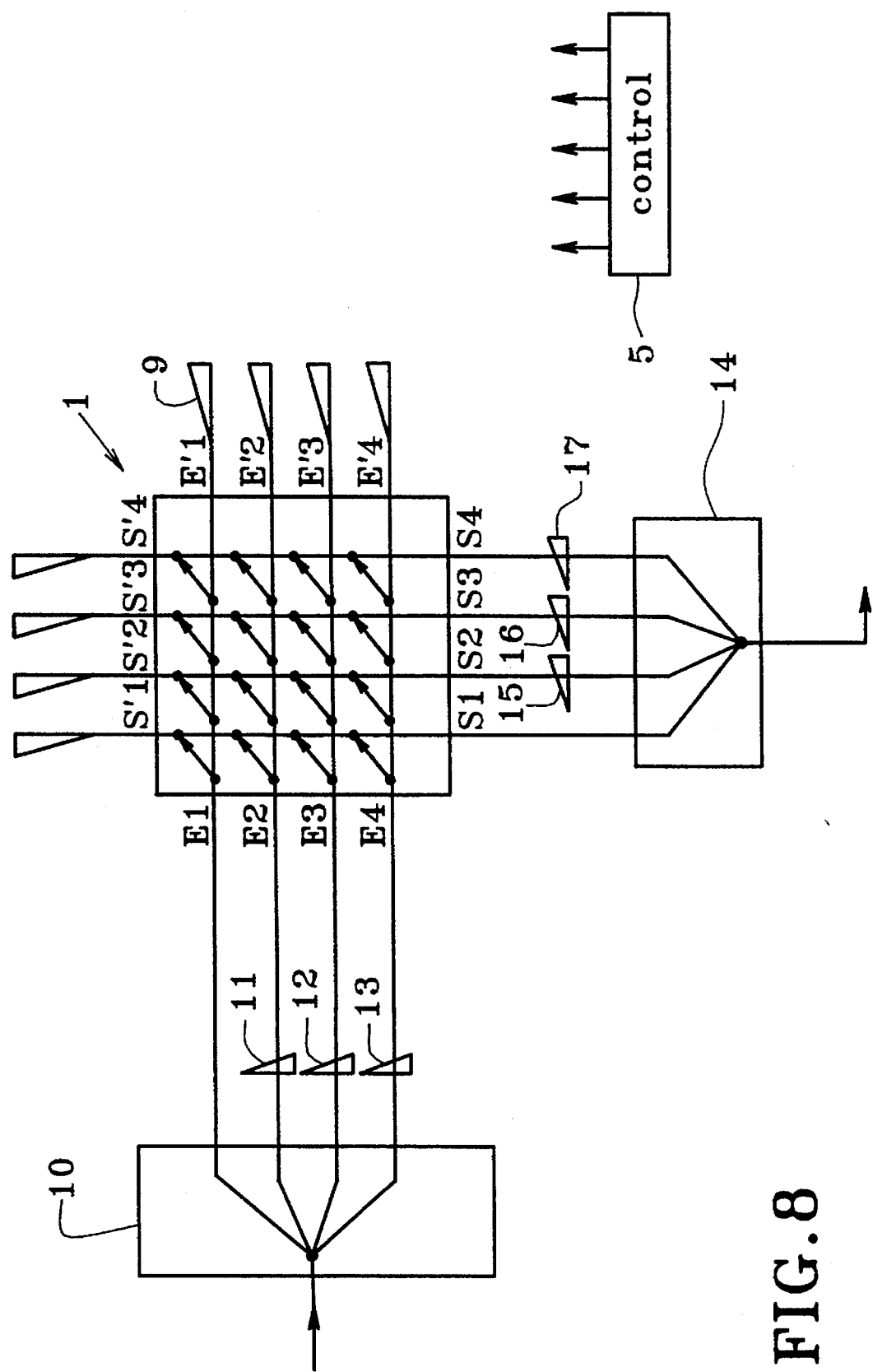
FIG. 8 is a diagram of a second embodiment of a device for controlling the amplitude of a transmitted signal.

FIG. 8 illustrates a device for digitally controlling amplitude and having low control power consumption. The input of the control device is connected to a power-divider 10 comprising four outputs, a first output of the power-divider 10 being connected to the terminal E1 of a switching block 1 that includes a matrix of 4×4 switching elements 4. A second output of the power-divider 10 is connected to the terminal E2 of the switching block 1 via a resistor 11 forming an attenuator. A third output of the power-divider 10 is connected to the terminal E3 of the switching block 1 via a resistor 12 forming an attenuator. A fourth output of the power-divider 10 is connected to the terminal E4 of the switching block 1 via a resistor 13 forming an attenuator. The terminal S1 of the switching block 1 is directly connected to a first input of a combiner 14. The terminal S2 is connected to a second input of the combiner 14 via a resistor 15 forming an attenuator. The terminal S3 of the switching block 1 is connected to a third input of the combiner 14 via a resistor 16 forming an attenuator. The terminal S4 of the switching block 1 is connected via an attenuator-forming resistor 17 to a fourth input of the combiner 14. In a first embodiment, the combiner 10 and the power-divider 14 are passive and of known type comprising delay lines (Wilkinson combiner) and/or resistors.

In a second embodiment, switching blocks 1 are used for combining and/or dividing signals.

The resistor 11 has a resistance R equal to 50 Ω, for example, and the other resistors have the following values:

resistor 12:2 R;

resistor 13:3 R;

resistor 15:4 R;

resistor 16:8 R;

resistor 17:12 R.

When a signal of non-zero amplitude is present at the input of the power-divider 10, the amplitude at the output from the combiner 14 depends on the ON or OFF states of the various switches 4 in the switching block 1.

Figure 9:
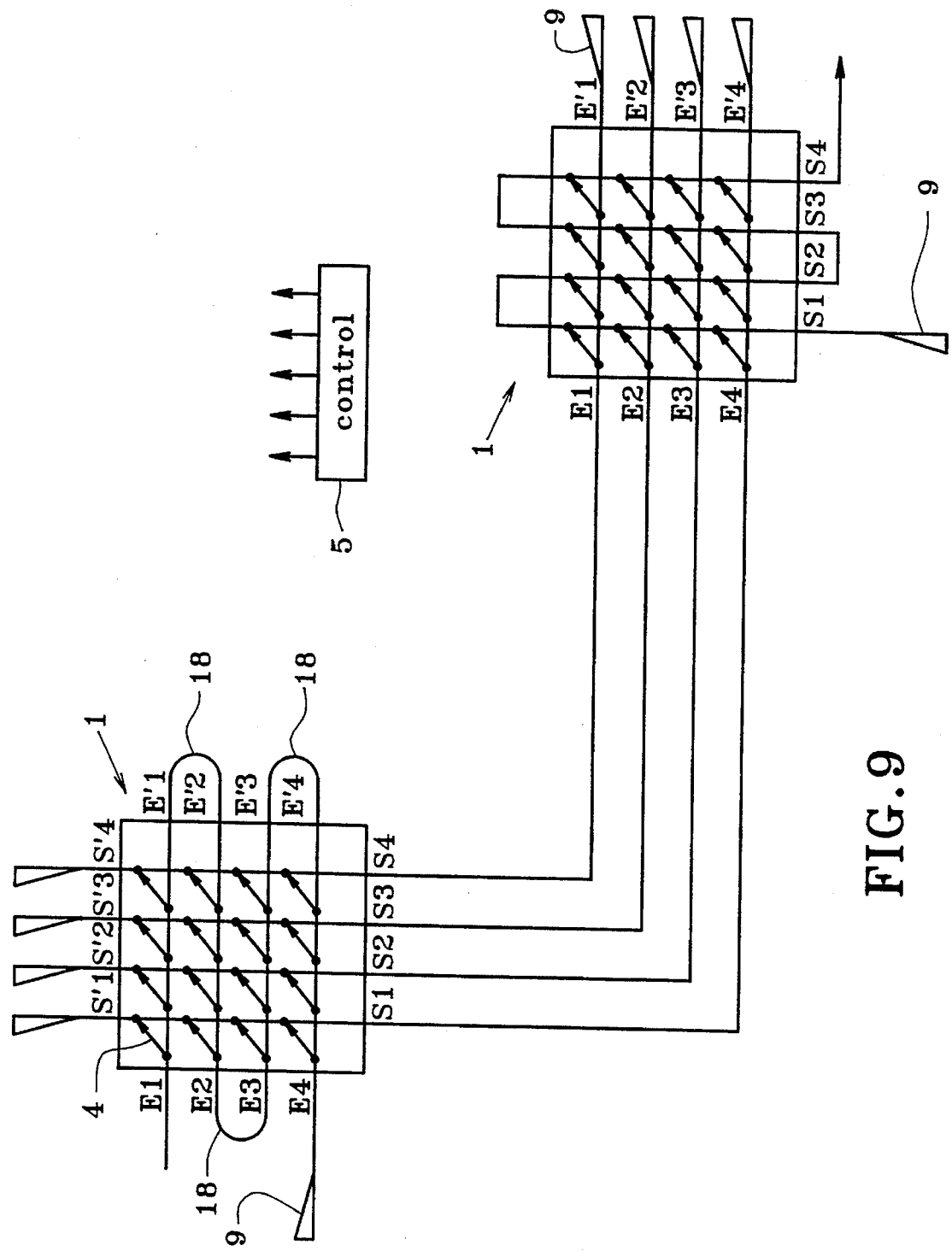
FIG. 9 is a diagram of a vector modulator type signal shaping device.

In FIG. 9, there can be seen a vector modulator type of signal processing device comprising a first switching block 1 whose successive input lines are phase shifted relative to one another, and a second switching block 1 enabling the various signals coming from the first switching block to be collected. In the example shown, two consecutive input lines are connected together by a delay line 18 that provides a signal phase shift of $\pi/2$, the end of the last input line being Advantageously connected to a matched load 9 connected to ground. Each output line from the first switching block 1 is connected to a single input line of the second switching block 1 which comprises cabling analogous to the cabling of the second switching block of the device shown in FIG. 7.

The modulator of FIG. 9 enables the various phases of an RF signal to be combined in amplitude.

The present invention is particularly applicable to distribution and processing of radiofrequency signals.

The present invention is mainly applicable to military equipment such as radars, to space equipment such as satellites, and also to telecommunications equipments.

We claim:

1. A switching cell transmission device comprising:
   a) a multiplexer switching cell including:
      n (where n is an integer greater than 1) input lines;
      an output line;
      n one-way radiofrequency switching elements connecting the n input lines to the output line;
   b) a demultiplexer switching cell including:
      an input line;
      n output lines;
      n one-way RF switching elements connecting, on command, the input line to the n output lines;
   c) a transmission line connecting the output line of the multiplexer to the input line of the demultiplexer; and
   d) at least one control circuit ensuring synchronous sequential distribution of the switching elements of the multiplexer and of the demultiplexer switching cells.

2. A switching cell transmission device according to claim 1, characterized in that the one-way RF switching elements are dual gate FETs.

3. A switching cell transmission device comprising:
   a) a multiplexer switching cell including:
      n (where n is an integer greater than 1) input lines;
      an output line;
      n one-way RF switching elements connecting the n input lines to the output lines;
   b) n bandpass filters centered on n frequencies, each connected to one of the n input lines of the multiplexer;
   c) a demultiplexer switching cell including:
      an input line;
      n output lines;
      n one-way RF switching elements connecting on command the input line to the n output lines;
   d) a transmission line connecting the output line of the multiplexer to the input line of the demultiplexer; and
   e) at least one control circuit ensuring synchronous, sequential, or simultaneous switching of the switching elements of the demultiplexer.

4. A switching cell transmission device according to claim 3, characterized in that the one-way RF switching elements are dual gate FETs.

* * * * *